(12) United States Patent
Mihajlovic et al.

(10) Patent No.: US 10,726,893 B2
(45) Date of Patent: Jul. 28, 2020

(54) PERPENDICULAR SOT-MRAM MEMORY CELL USING SPIN SWAPPING INDUCED SPIN CURRENT

(71) Applicant: SANDISK TECHNOLOGIES LLC, Addison, TX (US)

(72) Inventors: Goran Mihajlovic, San Jose, CA (US); Oleksandr Mosendz, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/217,292

(22) Filed: Dec. 12, 2018

(65) Prior Publication Data

US 2020/0043538 A1 Feb. 6, 2020

Related U.S. Application Data

(60) Provisional application No. 62/714,001, filed on Aug. 2, 2018.

(51) Int. Cl.
| | |
|---|---|
| *G11C 11/16* | (2006.01) |
| *H01L 27/22* | (2006.01) |
| *H01L 43/06* | (2006.01) |
| *H01L 43/08* | (2006.01) |

(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01); *H01L 27/226* (2013.01); *H01L 43/06* (2013.01); *H01L 43/08* (2013.01)

(58) Field of Classification Search
None
See application file for complete search history.

(56) References Cited

U.S. PATENT DOCUMENTS

| 9,343,658 | B2 | 5/2016 | Wang | |
|---|---|---|---|---|
| 2016/0225424 | A1 | 8/2016 | Qiu | |
| 2018/0090194 | A1* | 3/2018 | Silva | ............. G11C 11/18 |

OTHER PUBLICATIONS

Lau, et al., "Spin-orbit torque switching without external field with a ferromagnetic exchange-biased coupling layer," available at: https://www.nature.com/articles/nnano.2016.84, Nov. 18, 2015.
Avci, et al., "Fieldlike and antidamping spin-orbit torques in as-grown and annealed Ta/CoFeB/MgO layers," 2014 American Physical Society, Jun. 2014.

(Continued)

*Primary Examiner* — James G Norman
(74) *Attorney, Agent, or Firm* — Vierra Magen Marcus LLP

(57) ABSTRACT

A perpendicular spin orbit torque MRAM memory cell comprises a magnetic tunnel junction that includes a free layer in a plane, a ferromagnetic layer and a spacer layer between the ferromagnetic layer and the free layer. The free layer comprises a switchable direction of magnetization perpendicular to the plane. The ferromagnetic layer is configured to generate perpendicularly polarized spin current in response to an electrical current through the ferromagnetic layer and inject the perpendicularly polarized spin current through the spacer layer into the free layer to change the direction of magnetization of the free layer.

19 Claims, 8 Drawing Sheets

(56) References Cited

OTHER PUBLICATIONS

Yun, et al., "Critical switching current density induced by spin Hall effect in magnetic structures with first- and second-order perpendicular magnetic anisotropy," Scientific Reports, DOI: 10.1038/S41598-017-15681-2, Nov. 10, 2017.

* cited by examiner

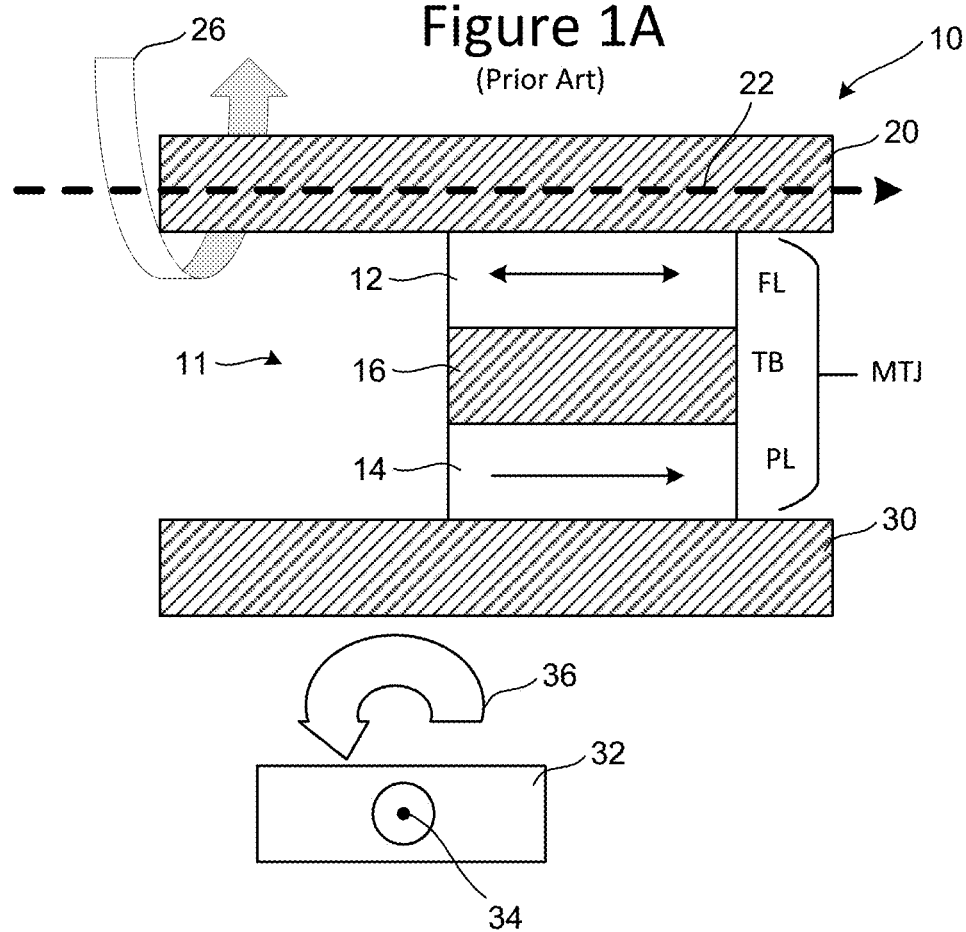
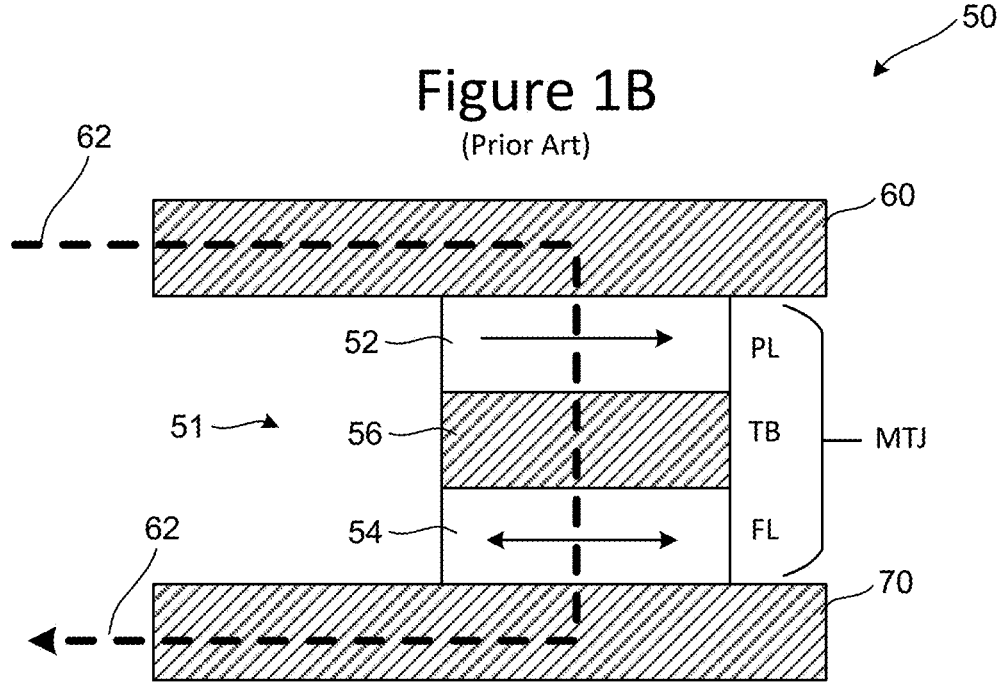

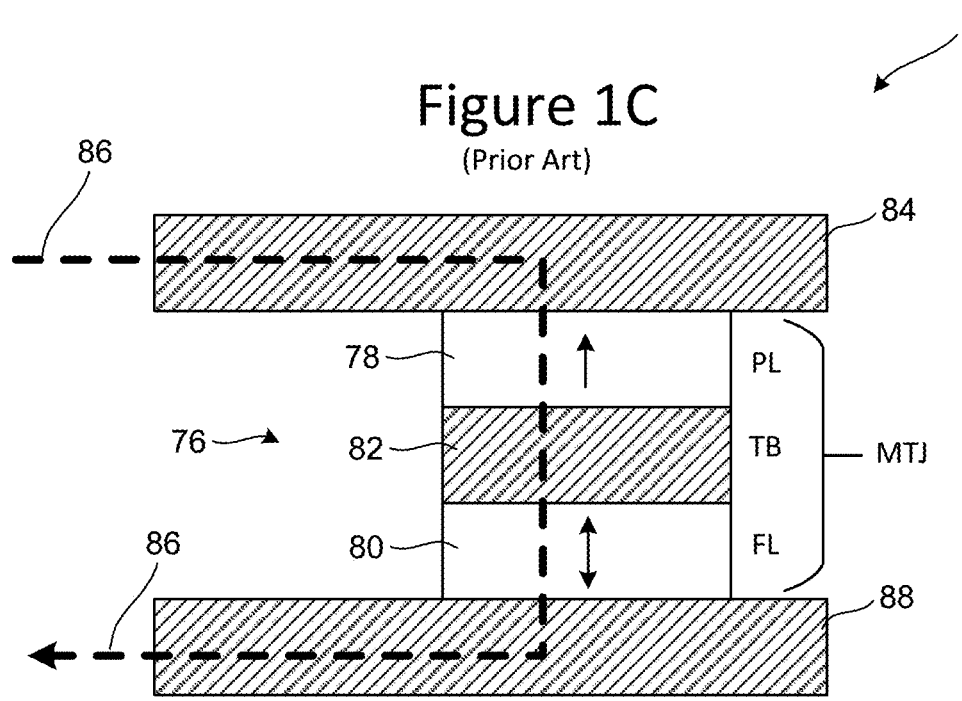
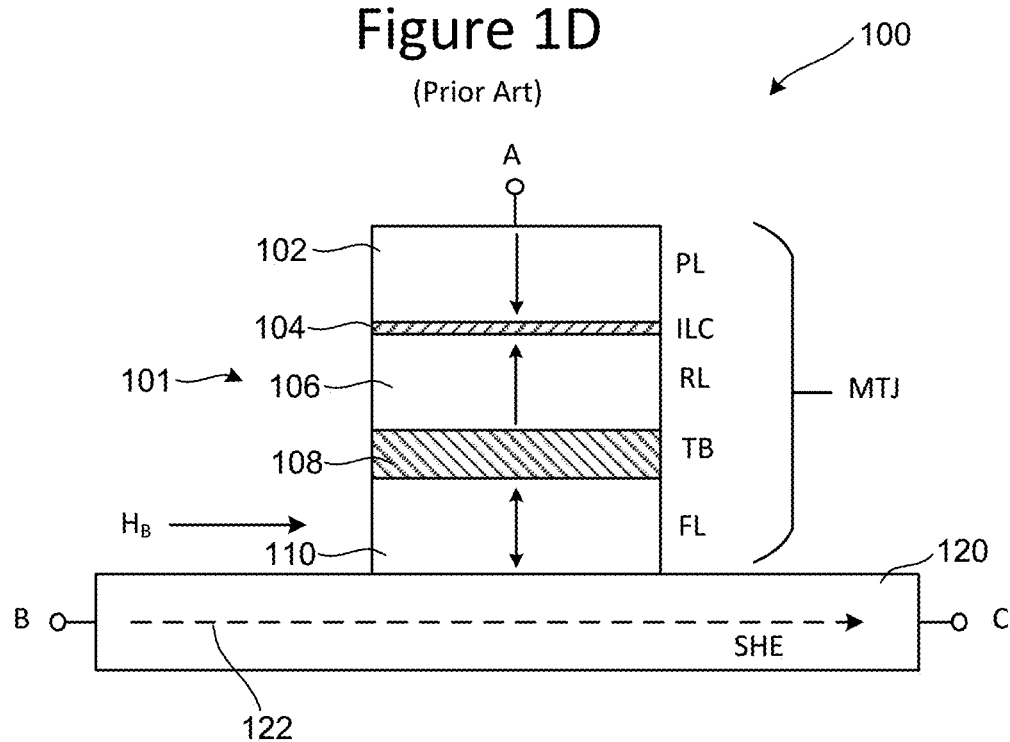

Figure 2
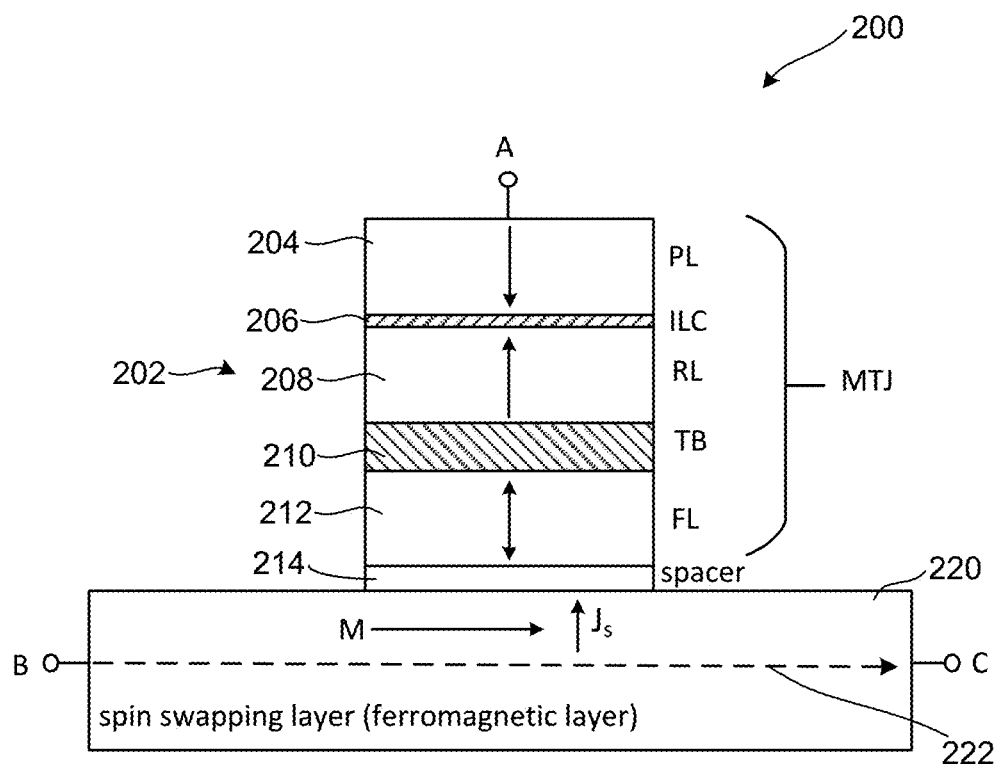
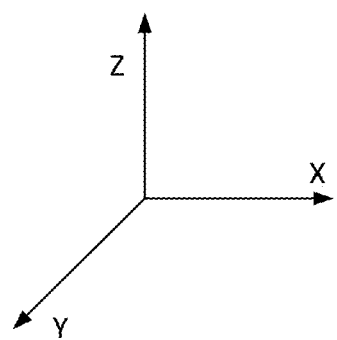

PERPENDICULAR SOT-MRAM MEMORY CELL USING SPIN SWAPPING INDUCED SPIN CURRENT

This application claims priority to Provisional Application 62/714,001, filed on Aug. 2, 2018, titled "Perpendicular SOT-MRAM Memory Cell Using Spin Swapping Induced Spin Current," incorporated herein by reference in its entirety.

BACKGROUND

Memory is widely used in various electronic devices such as cellular telephones, digital cameras, personal digital assistants, medical electronics, mobile computing devices, non-mobile computing devices and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Although MRAM is a promising technology, previous MRAM memory cells operated inefficiently and/or did not switch deterministically.

BRIEF DESCRIPTION OF THE DRAWINGS

Like-numbered elements refer to common components in the different figures.

FIG. 1A is a block diagram of a MRAM memory cell.
FIG. 1B is a block diagram of a MRAM memory cell.
FIG. 1C is a block diagram of a MRAM memory cell.
FIG. 1D is a block diagram of a MRAM memory cell.
FIG. 2 depicts one embodiment of a proposed MRAM memory cell that uses spin swapping.

DETAILED DESCRIPTION

Figure 1E:
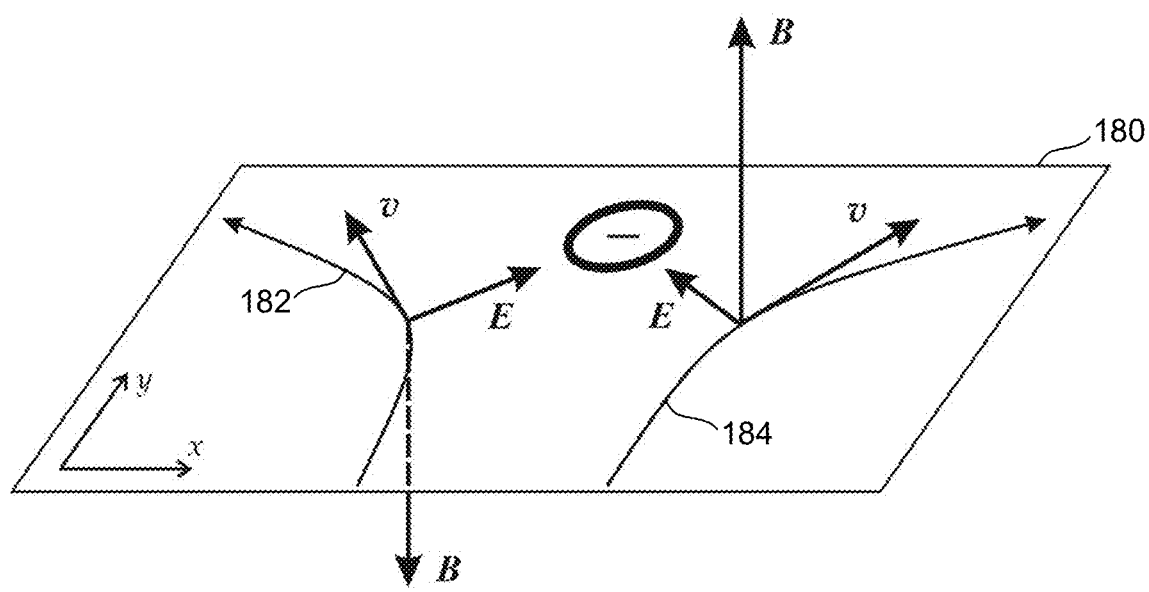
FIG. 1E depicts electron scattering by a negative charge.

FIG. 1A is a schematic perspective view of a prior MRAM memory cell 10 that makes use of field induced switching. Generally, MRAM cell 10 includes a magnetic tunnel junction (MTJ) 11 comprising an upper ferromagnetic layer 12, a lower ferromagnetic layer 14, and a tunnel barrier (TB) 16 which is an insulating layer between the two ferromagnetic layers. In this example, upper ferromagnetic layer 12 is a free layer FL and the direction of its magnetization can be switched. Lower ferromagnetic layer 14 is a pinned (or fixed) layer PL and the direction of its magnetization does not change.

When the magnetization in free layer FL 12 is parallel to the magnetization in pinned layer PL 14, the resistance across the memory cell is relatively low due, at least in part, to spin dependent scattering of the minority electrons. When the magnetization in free layer FL 12 is anti-parallel to the magnetization in pinned layer PL 14, the resistance across memory cell 10 is relatively high due, at least in part, to spin dependent scattering of minority and majority electrons. The data ("0" or "1") in memory cell 10 is read by measuring the resistance of the memory cell 10. In this regard, electrical conductors 20/30 attached to memory cell 10 are utilized to read the MRAM data.

The direction of the magnetization in free layer 12 changes in response to current 34 flowing in a digit line 32 and in response to current 22 flowing in a write line 20 that generate magnetic fields 36 and 26 respectively. FIG. 1A depicts the situation where the current 34 in digit line 32 is flowing out of the page and the current 22 in write line 20 is flowing from left to right resulting in two fields that are orthogonal, which will cause the magnetization in free layer 12 to switch from parallel to anti-parallel relative to the magnetization in fixed layer 14. The orientation of a bit is switched by reversing the polarity of the current 22 in the write line 20 while keeping a constant polarity of the current 34 in the digit line 32.

The field induced switching technique described above for the memory cell of FIG. 1A has some practical limitations, particularly when the design calls for scaling the memory cell to smaller dimensions. For example, since this technique requires two sets of magnetic field write lines, the array of MRAM cells is susceptible to bit disturbs (i.e., neighboring cells may be unintentionally altered in response to the write current directed to a given cell). Furthermore, decreasing the physical size of the MRAM memory cells results in lower magnetic stability against magnetization switching due to thermal fluctuations. The stability of the bit can be enhanced by utilizing a magnetic material for the free layer with a large magnetic anisotropy and therefore a large switching field, but then the currents required to generate a magnetic field strong enough to switch the bit are impractical in existing applications.

Spin-transfer-torque (STT) switching is another technique for programming MRAM memory cells. FIG. 1B is a schematic representation of an STT-switching technique for an MRAM cell 50 that includes a magnetic tunnel junction (MTJ) 51 comprising an upper ferromagnetic layer 52, a lower ferromagnetic layer 54, and a tunnel barrier (TB) 56 which is an insulating layer between the two ferromagnetic layers. In this example, lower ferromagnetic layer 54 is the free layer FL and the direction of its magnetization can be switched. Upper ferromagnetic layer 52 is the pinned (or fixed) layer PL and the direction of its magnetization is not easily changed. When the magnetization in free layer 54 is parallel to the magnetization in pinned layer PL 52, the resistance across the memory cell 50 is relatively low. When the magnetization in free layer FL 54 is anti-parallel to the magnetization in pinned layer PL 52, the resistance across memory cell 50 is relatively high. The data ("0" or "1") in memory cell 50 is read by measuring the resistance of the memory cell 50. In this regard, electrical conductors 60/70 attached to memory cell 50 are utilized to read the MRAM data. By design, both the parallel and antiparallel configurations remain stable in the quiescent state and/or during a read operation (at sufficiently low read current).

In the remaining text and figures, direction of the write current is defined as the direction of the electron flow. Therefore, the term write current refers to an electron current.

To "set" the MRAM cell bit value (i.e., choose the direction of the free layer magnetization), an electrical write current 62 is applied from conductor 60 to conductor 70. The electrons in the write current become spin-polarized as they pass through pinned layer 52 because pinned layer 52 is a ferromagnetic metal. While conduction electrons in a ferromagnetic metal will have spin orientation collinear with the direction of magnetization, a substantial majority of them will have a particular orientation that is parallel to the direction of magnetization, yielding a net spin polarized current. (Electron spin refers to angular momentum, which is directly proportional to but antiparallel in direction to the magnetic moment of the electron, but this directional distinction will not be used going forward for ease of discussion.) When the spin-polarized electrons tunnel across the tunnel barrier 56, conservation of angular momentum can result in the imparting of a torque on both free layer 54 and pinned layer 52, but this torque is inadequate (by design) to effect the magnetization direction of the pinned layer. Contrastingly, this torque is (by design) sufficient to switch the magnetization orientation in the free layer 54 to become parallel to that of the pinned layer 52 if the initial magnetization orientation of the free layer 54 was antiparallel to the pinned layer 52. The parallel magnetizations will then remain stable before and after such write current is turned off. In contrast, if free layer 54 and pinned layer 52 magnetizations are initially parallel, the free layer magnetization can be STT-switched to become antiparallel to the pinned layer 52 by application of a write current of opposite direction to the aforementioned case. Thus, by way of the same STT physics, the direction of the magnetization of free-layer 54 can be deterministically set into either of two stable orientations by judicious choice of the write current direction (polarity).

The MRAM memory cell of FIG. 1B uses materials in which both the pinned and free-layer magnetization are in the in-plane direction. In contrast, FIG. 1C depicts a schematic representation of a STT-switching MRAM memory cell 75 in which both the pinned and free-layer magnetization are in the perpendicular direction. Memory cell 75 includes a magnetic tunnel junction (MTJ) 76 comprising an upper ferromagnetic layer 78, a lower ferromagnetic layer 80, and a tunnel barrier (TB) 82 which is an insulating layer between the two ferromagnetic layers. In this example, lower ferromagnetic layer 80 is the free layer FL and the direction of its magnetization can be switched. Upper ferromagnetic layer 78 is the pinned (or fixed) layer PL and the direction of its magnetization is not easily changed. When the magnetization in free layer 80 is parallel to the magnetization in pinned layer PL 78, the resistance across the memory cell 75 is relatively low. When the magnetization in free layer FL 80 is anti-parallel to the magnetization in pinned layer PL 78, the resistance across memory cell 50 is relatively high. The data ("0" or "1") in memory cell 75 is read by measuring the resistance of the memory cell 75. In this regard, electrical conductors 84/88 attached to memory cell 75 are utilized to read the MRAM data. By design, both the parallel and antiparallel configurations remain stable in the quiescent state and/or during a read operation (at sufficiently low read current). To "set" the MRAM cell bit value (i.e., choose the direction of the free layer magnetization), an electrical write current 86 is applied from conductor 84 to conductor 88 and the memory cell operates as discussed above with respect to FIG. 1B.

Compared to the earliest MRAM cells which used magnetic fields from current carrying conductors proximate to the MRAM cell, the STT switching technique requires relatively low power, virtually eliminates the problem of adjacent bit disturbs, and has more favorable scaling for higher cell densities (reduced MRAM cell size). The latter issue also favors STT-MRAM where the free and pinned layer magnetizations are orientated perpendicular to the film plane, rather than in-plane. In practice, however, STT switching requires that the full write current flow through the tunnel barrier, which negatively affects long term reliability of the STT MRAM cell due to the necessary stress of moderate to high write voltages across the tunnel barrier.

FIG. 1D depicts an alternative MRAM memory cell 100 that makes use of spin orbit torque (SOT) for switching the free layer using spin current. The spin of the electron is an intrinsic angular momentum, which is separate from the angular momentum due to its orbital motion. In a solid, the spins of many electrons can act together to affect the magnetic and electronic properties of a material, for example endowing it with a permanent magnetic moment as in a ferromagnet. In many materials, electron spins are equally present in both the up and the down directions, and no transport properties are dependent on spin. However, various techniques can be used to generate a spin-polarized population of electrons, resulting in an excess of spin up or spin down electrons, in order to change the properties of a material. This spin-polarized population of electrons moving in a common direction through a common material is referred to as a spin current. As described herein, a spin current can be used to operate a MRAM memory cell.

In general, Spin Hall Effect (SHE) may be used to generate spin current flowing in a transverse (perpendicular to plane) direction when applying a charge current flow in a longitudinal (in-plane) direction. The spin polarization direction of such an SHE-generated spin current is in the in-plane direction orthogonal to the charge current flow. Memory cell 100 includes three terminals A, B and C; magnetic tunnel junction (MTJ) 101; and SHE material 120. In one implementation, MTJ 101 could comprise a free layer, a tunnel barrier and a pined layer. In another implementation, MTJ 101 comprises pinned layer (PL) 102, inter-layer coupling (ILC) layer 104, reference layer (RL) 106, tunnel barrier (TB) 108 and free layer (FL) 110. The ILC layer 104 promotes a strong antiferromagnetic (i.e., anti-parallel) coupling between PL (102) and RL (106), such that their net magnetic moment mostly cancels, thus greatly reducing unwanted stray field on the free layer. SHE layer 120 comprises a heavy metal, such as Platinum, Tantalum or Tungsten, that has strong SHE. The direction of magnetization of Free Layer 110 is switched between up and down.

An advantage of the SOT-switching design that exploits the SHE is that the write current 122 passes solely through the SHE layer 120, and does not flow through the tunnel barrier 108. This eliminates the aforementioned long-term degradation of the tunnel barrier by the switching current in the prior STT switching design for MRAM cells. However, a disadvantage of the SOT switching design of FIG. 1D is a consequence of the fact that the SHE generated spin current flowing from SHE 120 into the free layer 110 has a spin polarization in-plane (i.e., orthogonal to free layer magnetization), rather than perpendicular-to-plane (i.e., collinear with free layer magnetization) as was the case for the STT switching design (FIG. 1B). The negative consequences of this orthogonality are twofold. Firstly, the critical write current density in the SHE layer 120 needed to begin the onset of the switching process can be many times larger than that for STT switching, because the physics of the switching process makes orthogonal SOT switching less intrinsically efficient (e.g., requires more current) than that of STT switching. Secondly, SHE-induced orthogonally polarized spin current entering the free layer 110 is destabilizing to either free layer orientation, and by itself cannot be used to deterministically set a preferred free layer magnetization direction. While this problem can be alleviated by applying an external bias field in a direction collinear with the charge current flow in the SHE layer 120, it would be a great technical difficulty to achieve means to provide the necessary strength of magnetic field at the cell level in a practical MRAM memory.

Another approach to solve the "orthogonality problem" intrinsic to SOT switching as shown in FIG. 1D is to instead use in-plane magnetized free layers and pinned layers, so the magnetization is once again collinear with the spin-polarization direction of the injected SHE-induced spin current. However, that option has the same aforementioned MRAM cell size scaling disadvantages which previously drove the technological preference towards perpendicular MRAM cell design. What is needed is an efficient MRAM memory cell design where the write current does not pass through the tunnel barrier, and which allows for deterministic switching of a perpendicular free layer simply by choice of write current polarity. One would also prefer to preserve the TMR based readback scheme, which allows for fast readback operation and makes whole system suitable for memory applications.

To remedy the above described deficiencies of prior MRAM memory cells, a new SOT MRAM memory cell is proposed that uses spin swapping induced spin current to switch the direction of magnetization of the free layer. Spin swapping is a mechanism in which a first spin current induces a transverse spin current with interchanged spin direction and direction of flow. In ferromagnets, the resulting spin accumulation exhibits a complex spatial profile, where the spin swapping effect is enhanced due to spin polarization and spin precession that gives rise to additional contributions to the anomalous charge and spin currents. These effects can be employed to generate spin-orbit mediated torques and reversibly control the magnetization in centrosymmetric structures.

Before describing the structure of the proposed new memory cell, background is provided on the spin swapping effect. Spin current is described by a tensor $q_{ij}$ where the first index indicates the direction of flow and the second one shows which component of spin is flowing. Below are the phenomenological equations describing the coupling between spin and charge currents, $q_{ij}$ and $q_i$ (more accurately, q is the electron flow density, related to the electric current density j by q=j/e, where e is the elementary charge).

$$q_i = q_i^{(0)} + \gamma \varepsilon_{ijk} q_{jk}^{(0)} \quad (1)$$

$$q_{ij} = q_{ij}^{(0)} + \gamma \varepsilon_{ijk} q_k^{(0)} \quad (2)$$

where $q_i^{(0)}$ and $q_{ij}^{(0)}$ are the primary currents, which may exist in the absence of spin-orbit interaction, $\varepsilon_{ijk}$ is the unit antisymmetric tensor, and $\gamma$ is a dimensionless parameter proportional to the strength of spin-orbit interaction.

Pure symmetry considerations allow for additional terms in Eq. (2) proportional to) $q_{ii}^{(0)}$ and $\delta_{ij} q_{kk}^{(0)}$, which describe transformations of spin currents. In the presence of electric field E and spin polarization P, this would result in additional contributions to $q_{ij}$ proportional to $E_j P_i$ and $\delta_{ij}(E \cdot P)$. These contributions are due to spin swapping which exists; therefore equation (2) should be modified as:

$$q_{ij} = q_{ij}^{(0)} + \gamma \varepsilon_{ijk} q_k^{(0)} + \chi(q_{ji}^{(0)} - \delta_{ij} q_{kk}^{(0)}) \quad (3)$$

with anew dimensionless parameter $\chi$. The resulting swapping of spin currents originates from the correlation between the scattering direction and spin rotation during collisions. This effect is more robust than the spin-charge coupling: the swapping constant $\chi$ exists already in the Born approximation, while $\gamma$ appears only beyond this approximation.

FIG. 1E depicts electron scattering, including spin dependent scattering, by a negative charge. The electron spin sees a magnetic field B~v×E perpendicular to the trajectory plane 180. Note that the magnetic field (and hence the sense of the spin rotation) has opposite directions for electrons scattered to the left (electron trajectory 182) and to the right (electron trajectory 184).

FIG. 1E shows the magnetic field B that exists in the electron's moving frame and seen by the electron spin. This field is perpendicular to the plane 180 and the electron trajectory, and has opposite signs for electrons moving to the right (electron trajectory 184) and to the left (electron trajectory 182) of the charged center. The Zeeman energy of the electron spin in this field is the spin-orbit interaction.

Three spin-dependent effects can be seen in FIG. 1E. If there is a metallic material with charge impurity, an electron moving in the material feels the electric field from the impurity. Spin orbit coupling includes the moving electron at velocity v experiencing an electric field that is transformed into an effective magnetic field. (1) The electrons feeling the magnetic field will process around the magnetic field, which changes the electron's spin. This precession of the electron spin around B during the collision, is referred to as Elliott-Yafet spin relaxation. (2) The spin asymmetry in scattering (the Mott effect, or skew scattering) results from the additional force proportional to the gradient of electron Zeeman energy. That is, the Spin Hall Effect includes a force that acts on the electrons based on their direction of spin. Some are diverted in one direction, while others are diverted in an opposite direction. This creates spin current based on SHE. This phenomena is stronger in heavy metals that are not ferromagnetic. (3) The third spin defendant effect is the spin swapping effect which is based on a correlation between the directions of electron spin precession and scattering. While the spin on the left trajectory 182 is rotated clockwise, the spin on the right trajectory is rotated counterclockwise. This correlation leads to a transformation of spin currents. The spin swapping is stronger and SHE is weaker in ferromagnetic materials, while the spin swapping is weaker and SHE is stronger in heavy metals.

Suppose that the incoming electrons move in the y direction and are polarized along y (spin current to $q_{yy}^{(0)}$). The electrons scattered to the left will acquire a small positive projection of spin on the x axis. The electrons scattered to the right will acquire a small positive negative projection of spin on the x axis. This means that the initial to $q_{yy}^{(0)}$ spin current is partly transformed to $-q_{xx}$. For the case when incoming (along y) electrons are polarized along x, a similar reasoning shows that the initial spin current $q_{yx}^{(0)}$. will give rise to $q_{xy}$. Thus, in the latter case, the spin direction and the direction of flow are interchanged. More details about spin swapping can be found in "Swapping Spin Current: Interchange Spin and Flow Directions," Maria B. Lifshits and Michel I. Dyakonov, Physical Review Letters, Vol. 103, 20 Oct. 2009, p. 18660, incorporated herein by reference in its entirety.

The above-described swapping of spin currents, referred to as the spin swapping effect, can be used in an MRAM memory cell to switch the direction of magnetization of the free layer. That is, a perpendicular spin orbit torque MRAM memory cell is proposed with deterministic switching without an external field provided by perpendicularly polarized spin current in the z-direction generated by the spin swapping effect. One example embodiment comprises a magnetic tunnel junction that includes a free layer in a plane, a ferromagnetic layer and a spacer layer between the ferromagnetic layer and the free layer. The free layer comprises a switchable direction of magnetization that is perpendicular to the plane. The ferromagnetic layer is configured to generate perpendicularly polarized spin current in response to an electrical current through the ferromagnetic layer and inject the perpendicularly polarized spin current through the spacer layer into the free layer to change the direction of magnetization of the free layer. The ferromagnetic layer is also referred to as a spin swapping layer because it induces the perpendicularly polarized spin current via spin swapping in response to the electrical current through the ferromagnetic layer.

FIG. 2 is a schematic perspective view of one embodiment of the proposed perpendicular spin orbit torque MRAM memory cell that has deterministic switching (without an external field) provided by perpendicularly polarized spin current in the z-direction generated by the spin swapping effect. For purposes of this document, a memory cell is a unit of storage in a memory system. Memory cell 200 includes three terminals A, B, and C; magnetic tunnel junction (MTJ) 202; spacer 214; and spin swapping layer 220 (also referred to as a ferromagnetic layer).

In general, a magnetic tunnel junction (MTJ) is an apparatus comprising two ferromagnets separated by a thin insulator. Thus, one embodiment of MTJ stack 202 includes a pinned layer, a free layer, and a tunnel barrier (insulation layer) between the pinned layer and the free layer. MTJ 202 can also have more than three layers. For example, as depicted in FIG. 2, MTJ 202 comprises pinned layer (PL) 204, inter-layer coupling (ILC) layer 206, reference layer (RL) 208, tunnel barrier (TB) 210 and free layer (FL) 212. Pinned layer 204 and reference layer 208 have fixed directions of magnetization, meaning that their direction of magnetization does not change. Pinned layer 204 can be many different types of materials including (but not limited to) multiple layers of Cobalt and/or an alloy of Cobalt and Iron. Reference layer 208 can be many different types of materials including (but not limited to) multiple layers of Cobalt and an alloy of Cobalt, Iron and Boron. In one example, ILC layer 206 is made of Ruthenium; however, other materials can also be used. Pinned layer 204 has a direction of magnetization that is opposite in direction to reference layer 208. For example, FIG. 2 shows the direction of magnetization of pinned layer 204 being down and the direction of magnetization of reference layer 208 being up. The direction of magnetization for both pinned layer 204 and reference layer 208 are perpendicular to the in-plane direction. To a large degree, the magnetization of reference layer 208 cancels out the magnetization of pinned layer 204 (or vice versa) to create in aggregate a combined layer with close to zero net magnetization. The ILC layer 206 promotes this antiparallel (i.e. antiferromagnetic) coupling between pinned layer 204 and reference layer 208. Pinned layer 204 is connected to terminal A (the first terminal).

In one embodiment, tunnel barrier 210 is made of Magnesium Oxide (MgO); however, other materials can also be used. Tunnel barrier 210 is positioned between free layer 212 and the one or more layers of fixed magnetization; therefore, in one embodiment tunnel barrier 210 is positioned between free layer 212 and reference layer 208. Free layer 212 is a ferromagnetic metal that possess the ability to change/switch its direction of magnetization. Multilayers based on transition metals like Co, Fe and their alloys can be used to form free layer 212. In one embodiment, free layer 212 comprises an alloy of Cobalt, Iron and Boron. In one embodiment, free layer 212 has a direction of magnetization that can be switched between up and down. Thus, the direction of magnetization of free layer 212 is perpendicular to the in-plane direction.

If the direction of magnetization of free layer 212 is parallel to the direction of magnetization of the reference layer 208, then memory cell 200 has a lower resistance. If the direction of magnetization of free layer 212 is antiparallel to the direction of magnetization of the reference layer 208, then memory cell 200 has a higher resistance. In some embodiments, low resistance represents a "0" bit and high resistance represents a "1" bit, or vice versa. The data ("0" or "1") stored in memory cell 100 is read by measuring the resistance of the memory cell 200. Reading is achieved by passing an electrical current between terminal A and either of terminal B or terminal C in order to sense the resistance of memory cell 200.

Below MTJ 202 is spin swapping layer 220. Spacer 214 is positioned between free layer 212 and spin swapping layer 220 (and, thus, between MTJ 202 and spin swapping layer 220). In one embodiment, a top surface of spacer 214 is adjacent and touching free layer 212 and a bottom surface of spacer 214 is adjacent and touching spin swapping layer 220. In one example implementation, spacer 214 is the same shape as MTJ 202 such that spacer 214 fits below MTJ 202.

For purposes of this document, a spin swapping layer is a layer of material that generates a resulting spin current in response to a write current through the spin swapping layer, where the resulting spin current is generated primarily by a spin swapping effect, which includes electrons of the write current experiencing a spin orbit torque interaction that comprises a first spin current in the spin swapping layer inducing a transverse spin current with interchanged spin direction and direction of flow. Spin swapping layer 220 can be a ferromagnet or a half metal with a high degree of spin polarization at the Fermi surface, which will allow for more efficient conversion of charge current into the spin current of the desired perpendicular polarization. In one set of embodiments, it is desirable to have a high degree of spin polarization and long spin diffusion length in the material used for the spin swapping layer 220. In one embodiment, spin swapping layer 220 is a ferromagnetic material that has its magnetic moment aligned in-plane. Heusler Alloys can also be used for spin swapping layer 220. Other examples of materials for the spin swapping layer include Cobalt Manganese Germanium and Cobalt Manganese Silicon. In one embodiment, the spin diffusion length of spin swapping layer 220 is greater than half the thickness of spin swapping layer 220. In another embodiment, the spin diffusion length of spin swapping layer 220 is greater than the entire thickness of spin swapping layer 220.

In one set of embodiments, it is desirable that spin swapping layer 220 does not touch free layer 212 because both spin swapping layer 220 and free layer 212 are ferromagnetic material which will try to align if they are touching. Therefore, spacer 214 (e.g., 1-10 nanometers in thickness) is positioned between spin swapping layer 220 and free layer 212 so that spin swapping layer 220 and free layer 212 are magnetically decoupled. In one embodiment, spacer 214 is a material that can efficiently transfer spin current and has a long spin diffusion length and high resistivity in order not to shunt write current 222. The spacer can be an alloy of the form $A_xB_{1-x}$ where A can be chosen from (but not limited to) the following set: Au, Ag, Cu, Pd; and B can be chosen from (but not limited to) the following set: Sn, Zn, Pt, Ni. The spacer can be a \material with lower conductivity and high spin diffusion. A topological insulator, or Rashba 2D material can also be used. In one set of embodiments, spacer 214 is made from Copper, Silver or a Silver Tin alloy.

The embodiment graphically depicted in FIG. 2 shows the direction of magnetization of pinned layer 204 being down, the direction of magnetization of reference layer 208 being up, and the direction of magnetization of free layer 212 being switchable between up and down, all of which are perpendicular to the plane (e.g., the plane of free layer 212).

Data is written to the memory cell of FIG. 2 by applying an electrical current through spin swapping layer 220. That is, for a write operation where the direction of magnetization of free layer 212 is to be switched, a current is applied between terminal B and terminal C. For example, FIG. 2 shows an electrical write current 222 through spin swapping layer 220 from terminal B to terminal C, which is used to write data to the memory cell of FIG. 2 by changing the direction of magnetization of free layer 212 to a first direction. A write current through spin swapping layer 220 from terminal C to terminal B is used to write data to the memory cell of FIG. 2 by changing the direction of magnetization of free layer 212 to a second direction that is anti-parallel to the first direction.

The electrons of write current 222 experience a spin orbit torque interaction that includes the spin swapping effect discussed above such that a perpendicularly polarized spin current is generated in response to the electrical write current 222 through spin swapping layer 220 by way of a spin orbit interaction that comprises a first spin current in spin swapping layer 220 inducing a transverse spin current with interchanged spin direction and direction of flow. Electrical current flows in the x direction in spin swapping layer 220, which has a direction of magnetization M in the x direction. Electrons moving in the plane of spin swapping layer 220 above/below scattering center feel effective magnetic field B that is in the +/−y direction. This magnetic field will induce spin current $J_s$ in the z direction, where the spin current $J_s$ has a direction of polarization that is perpendicular to the plane of spin swapping layer 220 (meaning that the direction of polarization of spin current $J_s$ is in the z direction—parallel to or antiparallel to the direction of magnetization of free layer 212). Thus, due to spin swapping effect, spin current $J_s$ flows upward towards space 214, through spacer 214, and into free layer 212. This spin current is polarized in the direction parallel or antiparallel to the direction of magnetization of free layer 212, thereby, exerting a more efficient torque on free layer 212. Such torque also enables deterministic switching of free layer 212

The direction of spin of the spin current that is injected from spin swapping layer 220 to free layer 212 is the same direction of polarization as the direction of magnetization of free layer 212. Current in spin swapping layer 220 is in plane. The magnetic moment is aligned in-plane. The spins are orientated in the same direction. A spin current is induced in spin swapping layer 220 in the z direction (e.g., up—see FIG. 2), which is collinear with the direction of magnetization of free layer 212. Thus, spin swapping layer 220 is magnetized in-plane and parallel to a direction of flow of the electrical write current 222.

To perform reading, a read current is applied from terminal A through MTJ 202 to terminal B or terminal C. The read current (not depicted) is typically a low current that will not harm tunnel barrier 210. By sensing the voltage drop across terminals A and B, the resistance of MTJ 202 can be determined. When the magnetization in free layer 212 is parallel to the magnetization in reference layer 208 (or the combination of pinned layer 204 and reference layer 208), the resistance across memory cell 200 is relatively low. When the magnetization in free layer 212 is anti-parallel to the magnetization in reference layer 208 (or the combination of pinned layer 204 and reference layer 208), the resistance across memory cell 200 is relatively high. Thus, MTJ 202 (i.e., free layer 212) exhibits a programmable resistance that can be detected in response to a read bias.

Some previous MRAM devices were two terminal memory cells that included shared read and write paths through the magnetic tunnel junction. The shared read and write paths created problems for endurance and reliability. For writing, the tunnel barrier layer in the magnetic tunnel junction should be sufficiently thin (and have relatively low enough resistance) to flow a current necessary for switching. However, a thin barrier layer is more susceptible to dielectric breakdown due to repeated write operations. The new proposed design of FIG. 2 does not require a write current that passes through the tunnel barrier 210. While spin current may diffuse into free layer 212, the write current 222 is passed through spin swapping layer 220 and not through MTJ 202. That is, the generated perpendicular spin polarization discussed above diffuses into free layer 212 and exerts a torque on the free layer 212 to change direction of magnetization of free layer 212 without a high electrical current passing through tunnel barrier 210 (the insulation layer).

Although it is discussed above that some embodiments of the structure of FIG. 2 write data by having the perpendicular spin polarization exert a torque on the free layer without an electrical current running through the magnetic tunnel junction stack, other embodiments write data by having the perpendicular spin polarization exert a torque on the free layer while a small electrical current runs through the magnetic tunnel junction stack. For example, in one embodiment, the generated perpendicular spin polarization exerts a torque on the free layer to change direction of magnetization of the free layer without an electrical current through the insulation layer that is greater than 1 MA/cm2.

Figure 3:
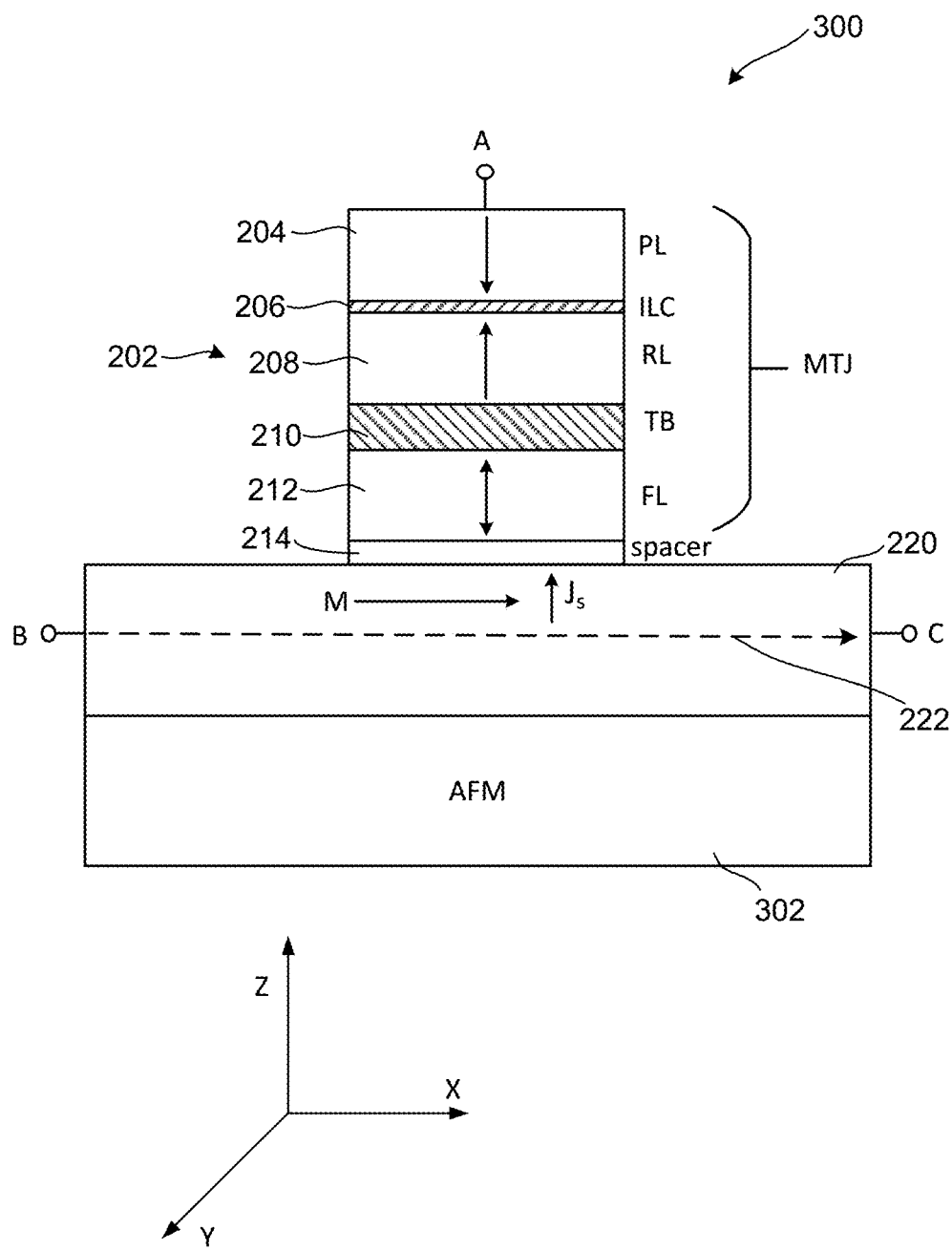
FIG. 3 depicts one embodiment of a proposed MRAM memory cell that uses spin swapping.

FIG. 3 is a perspective view of another embodiment of the proposed perpendicular spin orbit torque MRAM memory cell that has deterministic switching (without an external field) provided by perpendicularly polarized spin current in the z-direction generated by the spin swapping effect. Memory cell 300 of FIG. 3 includes the same MTJ 202, spacer 214 and spin swapping layer (also referred to as a ferromagnetic layer) 220 as memory cell 200 of FIG. 2. Additionally, memory cell 300 includes antiferromagnetic layer 302 adjacent and below spin swapping layer 220. The antiferromagnetic layer and spin swapping layer are configured such that exchange bias from the antiferromagnetic layer 302 pins a direction of magnetization of the spin swapping layer 220. In this manner the direction of magnetization of spin swapping layer 220 is fixed and maintained in the direction that maximizes generation of perpendicularly polarized spin current density via the spin swapping effect.

In materials that exhibit anti-ferromagnetism, the magnetic moments of atoms or molecules (related to the spins of electrons) align in a regular pattern with neighboring spins (on different sub-lattices) pointing in opposite directions to realize zero net magnetization. That is magnetic moments align themselves into opposite, or antiparallel, arrangements throughout the material so that it exhibits almost no aggregate external magnetism. When an antiferromagnetic material is in contact with a ferromagnetic material, the ferromagnetic material will couple to the antiferromagnetic material at the interface such that there will be a strong interaction between the magnetic moments at the interface between the antiferromagnetic material and the ferromagnetic material in order to align them, thereby creating a preferred magnetization direction for the ferromagnet. This phenomenon is called "exchange bias." Due to the coupling between the antiferromagnetic material and the ferromagnetic material, it is significantly more difficult to change the direction of magnetization of the ferromagnetic material. Examples of suitable materials for antiferromagnetic layer 302 are IrMn, FeMn, PtMn, and NiMn. Other materials can also be used.

Figure 4:
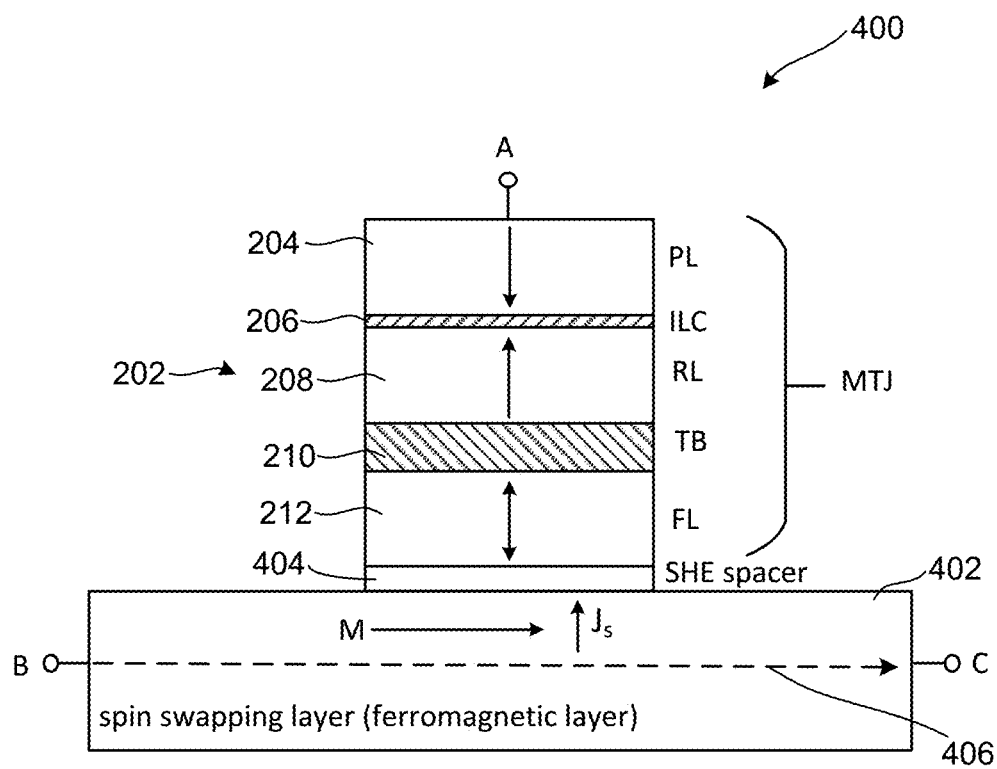
FIG. 4 depicts one embodiment of a proposed MRAM memory cell that uses spin swapping.

FIG. 4 is a perspective view of another embodiment of the proposed perpendicular spin orbit torque MRAM memory cell that has deterministic switching (without an external field) provided by perpendicularly polarized spin current in the z-direction generated by the spin swapping effect. Memory cell 400 of FIG. 4 includes the same MTJ 202 as memory cell 200 of FIG. 2. Memory cell 300 also includes spin swapping layer 402 (also referred to as a ferromagnetic layer) which is analogous to spin swapping layer 220 of FIG. 2. Between spin swapping layer 402 and free layer 212 is SHE spacer 404.

SHE spacer 404 serves to magnetically decouple spin swapping layer 402 and free layer 212. Additionally, SHE spacer 404 provides a second source of spin current based on spin orbit interaction. Thus, memory cell 400 includes generating two different spin currents in response to electrical write current 406 between terminal B to terminal C. The first spin current is a perpendicular spin current that is generated in spin swapping layer 402 due to the spin swapping effect in response to electrical write current 406. The second spin current is in-plane spin current generated in SHE spacer 404 due to the Spin Hall Effect in response to electrical write current 406. The amount of in-plane spin current can be controlled with the thickness of SHE spacer 404 and the conductivity ratio. SHE spacer 404 can be fabricated from a non-ferommagnetic conventional SOT layer, like Pt, or beta W. Both spin currents are injected into the free layer 212 in order to apply a spin orbit torque on free layer 212 in order to change the direction of magnetization of free layer 212 (e.g., either up to down or down to up). In this embodiment, memory cell 400 will have both polarizations (in-plane and perpendicular) of spin current injected into free layer 212, which create an assisted switching mechanism. In one embodiment, the perpendicular spin current is the primary spin current for switching and the in-plane polarized spin current spin current injected into free layer 212 assists changing the direction of magnetization of free layer 212. However, the roles of primary spin current and assisting spin current can be changed and/or engineered. The thickness and resistance of the SHE spacer layer 404 as well as the thickness and resistance of the spin swapping layer 402 can be adjusted to adjust the respective amount of spin current. A greater thickness and lower resistance results in larger spin current for the respective layer.

In the case when spin current is dominated by in-plane spin polarization (e.g., thicker and lower resistance SHE spacer layer with thinner and higher resistance spin swapping layer) the switching will be determined by the Spin Hall Effect based spin current but the assisting spin current from the spin swapping layer will generate an effective in-plane magnetic field that will provide deterministic switching. This eliminates the need for external magnetic field on chip. Thus, in one embodiment, spin swapping layer 402 provides an effective magnetic in-plane field to break the symmetry and reversal of the free layer 212 is achieved via the SHE mechanism.

In the case when spin current is dominated by perpendicular spin polarization (e.g., thicker and lower resistance spin swapping layer with thinner and higher resistance SHE spacer layer) the switching current will be reduced in the precessional regime (sub 10 ns) as the in-plane spin polarization from the SHE layer 404 will move the magnetization away from its easy axis and help overcome the stagnation point. Thus, in one embodiment, SHE spacer layer 404 provides an initiation mechanism for tilting magnetization of the free layer away from its easy axis, thus reducing switching current in the fast regime (<10 ns).

Figure 5:
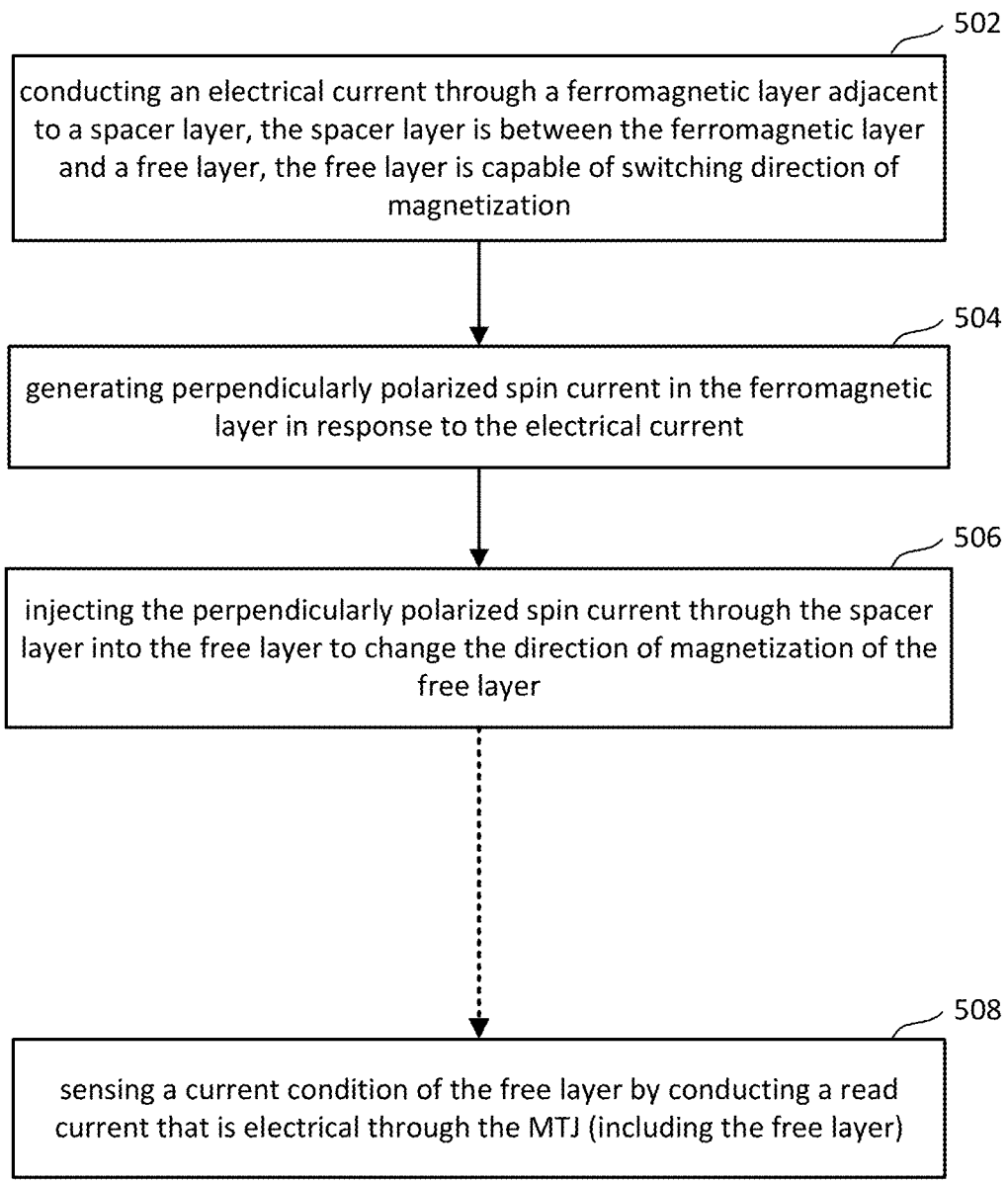
FIG. 5 is a flow chart describing one embodiment of a process performed to program a MRAM memory cell.

FIG. 5 is a flow chart describing one embodiment of a process performed to program a MRAM memory cell, such as memory cell 200 of FIG. 2, memory cell 300 of FIG. 3 and/or memory cell 400 of FIG. 4. In step 502, an electrical current (e.g., write current 222 or write current 406) is conducted through a ferromagnetic layer (e.g., spin swapping layer 220 or 402) adjacent to a spacer layer (e.g., spacer 214 or spacer 404). The spacer layer is between the ferromagnetic layer and a free layer. The free layer is capable of switching direction of magnetization, as discussed above with respect to free layer 212. In step 504, perpendicularly polarized spin current is generated in the ferromagnetic layer (e.g., spin swapping layer 220 or 402) in response to the electrical current (e.g., write current 222 or write current 406) due to spin swapping. In step 506, the generated perpendicularly polarized spin current is injected through the spacer layer into the free layer to change the direction of magnetization of the free layer. As a result, data is written to the memory cell. Step 508 is performed to read the memory cell by conducting an electrical read current through the MTJ (including through the free layer). The current condition of the free layer is sensed by sensing resistance of the MTJ based on sensing of the read current through the MTJ. FIG. 5 shows a dotted line to step 508 to indicate that step 508 may be performed much later after the completion of step 506 (or it can be performed immediately after step 506).

Figure 6:
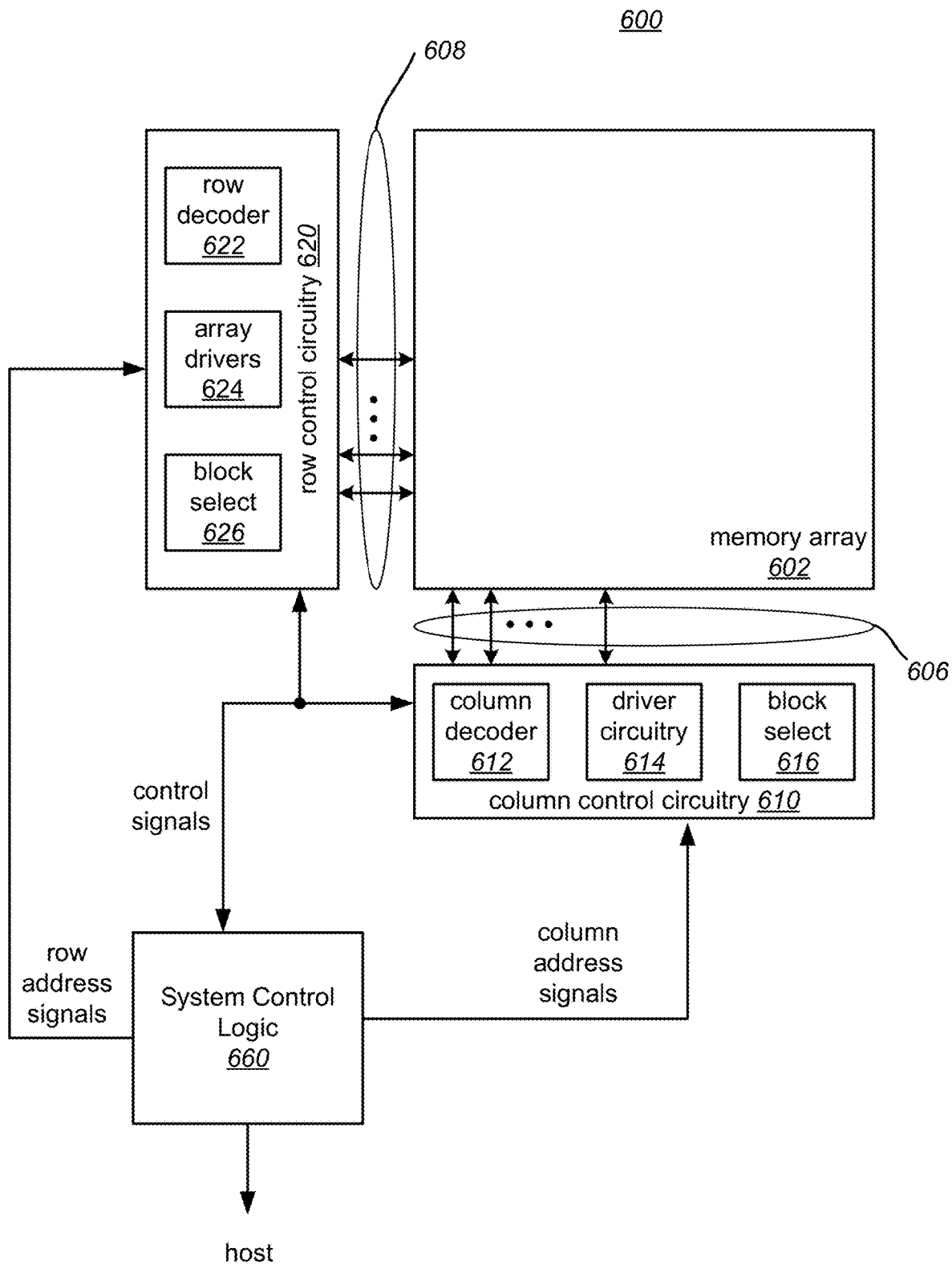
FIG. 6 is a block diagram of a memory system using the new memory cell proposed herein.

FIG. 6 is a block diagram that depicts one example of a memory system 600 that can implement the technology described herein. Memory system 600 includes a memory array 602 that can include any of memory cells described above. The array terminal lines of memory array 602 include the various layer(s) of word lines organized as rows, and the various layer(s) of bit lines organized as columns. However, other orientations can also be implemented. Memory system 600 includes row control circuitry 620, whose outputs 608 are connected to respective word lines of the memory array 602. Row control circuitry 620 receives a group of M row address signals and one or more various control signals from System Control Logic circuit 660, and typically may include such circuits as row decoders 622, array terminal drivers 624, and block select circuitry 626 for both reading and writing operations. Memory system 600 also includes column control circuitry 610 whose input/outputs 606 are connected to respective bit lines of the memory array 602. Column control circuitry 606 receives a group of N column address signals and one or more various control signals from System Control Logic 660, and typically may include such circuits as column decoders 612, array terminal receivers or drivers 614, block select circuitry 616, as well as read/write circuitry, and I/O multiplexers. System control logic 660 receives data and commands from a host and provides output data to the host and status. In other embodiments, system control logic 660 receives data and commands from a separate controller circuit and provides output data to that controller circuit, with the controller circuit communicating with the host. System control logic 660 may include one or more state machines, registers and other control logic for controlling the operation of memory system 600.

In one embodiment, all of the components depicted in FIG. 6 are arranged on a single integrated circuit. For example, system control logic 660, column control circuitry 610 and row control circuitry 620 are formed on the surface of a substrate and memory array 602 is formed one or above the substrate.

The discussion above provides details of a new proposed perpendicular spin orbit torque MRAM memory cell that can deterministically switch the direction of magnetization of the free layer by perpendicularly polarized spin current in a z-direction generated via a spin swapping effect without an external magnetic field.

One embodiment includes an apparatus that comprises a magnetic tunnel junction that includes a free layer in a plane, a ferromagnetic layer and a spacer layer between the ferromagnetic layer and the free layer. The free layer comprises a switchable direction of magnetization perpendicular to the plane. The ferromagnetic layer is configured to generate perpendicularly polarized spin current in response to an electrical current through the ferromagnetic layer and inject the perpendicularly polarized spin current through the spacer layer into the free layer to change the direction of magnetization of the free layer.

One embodiment includes a method comprising conducting an electrical current through a ferromagnetic layer adjacent to a spacer layer, the spacer layer is between the ferromagnetic layer and a free layer, the free layer is capable of switching direction of magnetization; generating perpendicularly polarized spin current in the ferromagnetic layer in response to the electrical current; and injecting the perpendicularly polarized spin current through the spacer layer into the free layer to change the direction of magnetization of the free layer. In one example implementation, the ferromagnetic layer is configured to generate the perpendicularly polarized spin current in response to the electrical current through the ferromagnetic layer by way of a spin orbit interaction (ie spin swapping) that comprises a first spin current in the ferromagnetic layer inducing a transverse spin current with interchanged spin direction and direction of flow (the transverse spin current is the perpendicularly polarized spin current).

One embodiment includes a perpendicular spin orbit torque MRAM memory cell comprising a magnetic tunnel junction that includes a free layer capable of switching direction of magnetization and means for deterministically switching the direction of magnetization of the free layer by perpendicularly polarized spin current in a z-direction generated via a spin swapping effect without an external magnetic field. One embodiment of the means for deterministically switching the direction of magnetization of the free layer comprises a ferromagnetic layer and a spacer layer between the ferromagnetic layer and the free layer. Examples of the ferromagnetic layer include spin swapping layer 220 of FIGS. 2 and 3 performing the process of FIG. 5, and spin swapping layer 402 of FIG. 4 performing the process of FIG. 5. Examples of the spacer layer include spacer layer 214 of FIGS. 2 and 3, and spacer layer 404 of FIG. 4.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a magnetic tunnel junction that includes a free layer in a plane, the free layer comprising a switchable direction of magnetization perpendicular to the plane;
a ferromagnetic layer; and
a spacer layer between the ferromagnetic layer and the free layer, the ferromagnetic layer is configured to generate perpendicularly polarized spin current by way of spin swapping in response to an electrical current through the ferromagnetic layer, the ferromagnetic layer is further configured to inject the perpendicularly polarized spin current into and through the spacer layer and into the free layer from the spacer layer to change the direction of magnetization of the free layer, the perpendicularly polarized spin current is polarized perpendicular to the plane.

2. The apparatus of claim 1, wherein:
the ferromagnetic layer is configured to generate the perpendicularly polarized spin current in response to the electrical current through the ferromagnetic layer by way of a spin orbit interaction that comprises a first spin current in the ferromagnetic layer inducing a transverse spin current with interchanged spin direction and direction of flow, the transverse spin current comprising the perpendicularly polarized spin current.

3. The apparatus of claim 1, wherein:
the ferromagnetic layer is magnetized in-plane.

4. The apparatus of claim 1, wherein:
the ferromagnetic layer is magnetized parallel to a direction of flow of the electrical current.

5. The apparatus of claim 1, wherein:
the ferromagnetic layer is a metal with a high degree of spin polarization.

6. The apparatus of claim 1, wherein:
the ferromagnetic layer has a spin diffusion length that is greater than half of a thickness of the ferromagnetic layer.

7. The apparatus of claim 1, wherein:
the ferromagnetic layer has a spin diffusion length that is greater than a thickness of the ferromagnetic layer.

8. The apparatus of claim 1, wherein:
the magnetic tunnel junction, the ferromagnetic layer and the spacer comprise a spin orbit torque MRAM memory cell.

9. The apparatus of claim 1, wherein:
the ferromagnetic layer is a Heusler alloy.

10. The apparatus of claim 1, wherein:
the spacer layer is configured to magnetically decouple the ferromagnetic layer and the free layer.

11. The apparatus of claim 1, wherein:
the spacer layer is a Spin Hall Effect (SHE) layer.

12. The apparatus of claim 1, wherein:
the spacer layer comprises a non-ferromagnetic SHE layer that is configured to generate in-plane polarized spin current in response to the electrical current through the ferromagnetic layer and inject the in-plane polarized spin current spin current into the free layer to assist changing the direction of magnetization of the free layer.

13. The apparatus of claim 1, further comprising:
an anti-ferromagnetic layer adjacent to the ferromagnetic layer, the anti-ferromagnetic layer and ferromagnetic layer configured such that exchange bias from the anti-ferromagnetic layer pins a direction of magnetization of the ferromagnetic layer.

14. A method, comprising:
conducting an electrical current through a ferromagnetic layer adjacent to a spacer layer, the spacer layer is between the ferromagnetic layer and a free layer, the free layer is capable of switching direction of magnetization;
generating perpendicularly polarized spin current in the ferromagnetic layer in response to the electrical current, the generating perpendicularly polarized spin current comprises a first spin current in the ferromagnetic layer inducing a transverse spin current with interchanged spin direction and direction of flow, the transverse spin current is the perpendicularly polarized spin current; and
injecting the perpendicularly polarized spin current from the ferromagnetic layer through the spacer layer into the free layer to change the direction of magnetization of the free layer.

15. The method of claim 14, wherein:
the ferromagnetic layer and the free layer comprise a spin orbit torque MRAM memory cell.

16. The method of claim 14, further comprising:
sensing a current condition of the free layer by conducting a read current that is electrical through the free layer, the ferromagnetic layer and the free layer comprise a spin orbit torque MRAM memory cell, the sensing the current comprises reading the spin orbit torque MRAM memory cell, the injecting the perpendicularly polarized spin current through the spacer layer into the free layer to change the direction of magnetization of the free layer comprises writing to the spin orbit torque MRAM memory cell.

17. An apparatus, comprising:
a perpendicular spin orbit torque MRAM memory cell comprising:
a magnetic tunnel junction that includes a free layer in a plane capable of switching direction of magnetization; and
means for deterministically switching the direction of magnetization of the free layer by perpendicularly polarized spin current in a z-direction generated via a spin swapping effect without an external magnetic field, the perpendicularly polarized spin current is polarized perpendicular to the plane.

18. The apparatus of claim 17, wherein the means for deterministically switching the direction of magnetization of the free layer comprises:
a ferromagnetic layer having a first terminal and a second terminal; and
a spacer layer between the ferromagnetic layer and the free layer so that the ferromagnetic layer does not touch the free layer, the ferromagnetic layer configured to generate the perpendicularly polarized spin current in response to an electrical current through the ferromagnetic layer between the first terminal and the second terminal, the ferromagnetic layer configured to inject the spin current through the spacer layer into the free layer to change the direction of magnetization of the free layer.

19. The apparatus of claim 18, wherein:
the ferromagnetic layer is magnetized in-plane and parallel to a direction of the electrical current between the first terminal and the second terminal.

* * * * *